(12) United States Patent
Hino

(10) Patent No.: US 8,668,428 B2
(45) Date of Patent: Mar. 11, 2014

(54) HORIZONTAL ARTICULATED ROBOT AND SUBSTRATE TRANSFER SYSTEM PROVIDED WITH THE SAME

(75) Inventor: Kazunori Hino, Kitakyushu (JP)

(73) Assignee: Kabushiki Kaisha Yaskawa Denki, Kitakyushu-shi (JP)

( * ) Notice: Subject to any disclaimer, the term of this patent is extended or adjusted under 35 U.S.C. 154(b) by 486 days.

(21) Appl. No.: 13/064,171

(22) Filed: Mar. 9, 2011

(65) Prior Publication Data

US 2011/0262257 A1 Oct. 27, 2011

(30) Foreign Application Priority Data

Apr. 21, 2010 (JP) .................................. 2010-098054

(51) Int. Cl.
*B25J 18/04* (2006.01)
*H01L 21/683* (2006.01)

(52) U.S. Cl.
USPC .......... 414/744.5; 74/490.01; 901/15; 901/23

(58) Field of Classification Search
USPC ............. 414/744.1, 744.2, 744.5; 901/15, 23, 901/27; 74/490.01
See application file for complete search history.

(56) References Cited

U.S. PATENT DOCUMENTS

| | | | |
|---|---|---|---|
| 5,205,701 A * | 4/1993 | Kigami et al. | 414/744.5 |
| 6,297,611 B1 * | 10/2001 | Todorov et al. | 318/568.21 |
| 6,893,204 B1 | 5/2005 | Suzuki et al. | |
| 7,056,080 B2 * | 6/2006 | Ogawa et al. | 414/744.5 |
| 2009/0095111 A1 | 4/2009 | Kitahara et al. | |
| 2010/0290886 A1 * | 11/2010 | Hashimoto et al. | 414/800 |

FOREIGN PATENT DOCUMENTS

| | | |
|---|---|---|
| JP | S62-277285 | 12/1987 |
| JP | 1-240288 | 9/1989 |
| JP | 2-24075 | 1/1990 |
| JP | 2002-184834 | 6/2002 |
| JP | 2006-289555 | 10/2006 |
| JP | 2007-237342 | 9/2007 |
| JP | 2008-137115 | 6/2008 |
| JP | 2008-264980 | 11/2008 |

OTHER PUBLICATIONS

The Japanese Office Action dated Mar. 13, 2012 and English translation thereof.

* cited by examiner

*Primary Examiner* — Dean Kramer
(74) *Attorney, Agent, or Firm* — Bacon & Thomas, PLLC (57) ABSTRACT

A horizontal articulated robot includes a first arm and a second arm respectively supported at their base end portions by a body and the tip end portion of the second arm to be rotatable about a first joint and a second joint; and a fork including its base end portion supported by the tip end portion of the second arm to be rotatable about a third joint. The first arm includes a first enlarged portion, formed in its tip end portion, with an upper surface positioned higher than an upper surface of the base end portion of the first arm. The second arm includes a second enlarged portion, formed in its tip end portion, with a lower surface positioned lower than a lower surface of the base end portion of the second arm. The first and the second enlarged portion are at least partially overlapped with each other horizontally.

12 Claims, 6 Drawing Sheets

HORIZONTAL ARTICULATED ROBOT AND SUBSTRATE TRANSFER SYSTEM PROVIDED WITH THE SAME

FIELD OF THE INVENTION

The present invention relates to a horizontal articulated robot and a substrate transfer system provided with the horizontal articulated robot.

BACKGROUND OF THE INVENTION

In a semiconductor manufacturing apparatus, a liquid crystal production apparatus, an exposure apparatus and a substrate inspection apparatus (hereinafter collectively referred to as a "semiconductor manufacturing apparatus"), a horizontal articulated transfer robot is widely used to transfer a substrate such as a semiconductor wafer or a liquid crystal glass. The horizontal articulated robot includes a body, a plurality of arms connected to the body in multistage and a fork arranged at the tip end of the arms. The substrate is placed on the fork. The arms and the fork are configured to make rotation relative to each other. The substrate is transferred from one desired position to another by rotating the arms and the fork.

In the conventional horizontal articulated robot, motors as power sources for driving the arms and the fork and speed reducers are accommodated within the body. The torque of the motor is delivered to the corresponding arms or fork through transmission mechanisms such as pulleys and belts (see, e.g., JP2-24075A). The configuration in which all the motors are accommodated within the body as mentioned above can simplify the internal structures of the arms and, therefore, assists in making the arms smaller and thinner. If the arms become compact, they have an increased operating range within a limited narrow space like the interior of a semiconductor manufacturing apparatus.

With the configuration set forth above, however, the transmission mechanisms such as belts or the like become longer due to the increased distance between the motors and the driven objects. This makes it difficult to accurately drive the arms and the fork, which in turn impairs the operability of the arms and the fork. Therefore, the aforementioned configuration is unsuitable for use in an up-to-date semiconductor manufacturing apparatus in which a substrate is required to be transferred with high accuracy. Another problem of this configuration resides in that the internal structure of the body grows complex and the transmission mechanisms become lengthy with the number thereof increased.

As a solution to these problems, attempts have been made to arrange motors and speed reducers on or within arms, thereby simplifying transmission mechanisms and improving operability (see, e.g., JP2008-137115A, JP1-240288A, and JP2006-289555A). With the configuration in which the motors and the speed reducers are arranged on or within the arms, the distance between the motors and the driven objects becomes short. This helps improve the operability of the arms and the fork as compared with the configuration in which all the motors are accommodated within the body. Since, however, the motors and the speed reducers are arranged on or within the arms, the configuration noted just above suffers from problems in that the arms grow bigger and the motor for driving the arm closest to the body falls short of capacity, consequently impairing the operability.

In addition, the transfer robot for use in a semiconductor manufacturing apparatus is required to increase the number of substrates that can be transferred per unit hour. With a view to increase the number of substrates transferred by the robot, it has been proposed that a plurality of forks is provided in one set of arms (see, e.g., JP2002-184834A). In general, tubes for a fluid used in holding a substrate and cables for a sensor used in making sure accurate holding of the substrate are connected to the forks. The tubes and the cables extend from a body to the respective forks through the interior of the arms. For that reason, the arms need to have a space for appropriately dealing with the tubes and the cables connected to the forks as well as a space for accommodating the motors and the transmission mechanisms mentioned above. This is one of causes of increasing the size of the arms (see, e.g., JP2007-237342A).

As is apparent from the above, operability and compactness are required in the arms of the transfer robot particularly for use in the semiconductor manufacturing apparatus. Thus, a great deal of effort has heretofore been made to improve the shape and configuration of the arms.

SUMMARY OF THE INVENTION

In accordance with an aspect of the present invention, there is provided a horizontal articulated robot for use in transferring a substrate. The robot includes a body; a first arm including a base end portion and a tip end portion, the base end portion of the first arm being supported by the body to be rotatable about a first joint; a second arm including a base end portion and a tip end portion, the base end portion of the second arm being supported by the tip end portion of the first arm to be rotatable about a second joint; and a fork for holding the substrate, the fork including a base end portion supported by the tip end portion of the second arm to be rotatable about a third joint. The first arm includes a first enlarged portion formed in the tip end portion thereof, the first enlarged portion having an upper surface positioned higher than an upper surface of the base end portion of the first arm. The second arm includes a second enlarged portion formed in the tip end portion thereof, the second enlarged portion having a lower surface positioned lower than a lower surface of the base end portion of the second arm. The first enlarged portion and the second enlarged portion are at least partially overlapped with each other horizontally.

In accordance with another aspect of the present embodiment, there is provided a substrate transfer system comprising the horizontal articulated robot

BRIEF DESCRIPTION OF THE DRAWINGS

The objects and features of the present invention will become apparent from the following description of embodiments, given in conjunction with the accompanying drawings, in which.

DETAILED DESCRIPTION OF THE PREFERRED EMBODIMENTS

One embodiment of the present invention will now be described with reference to the accompanying drawings which form a part hereof.

Figure 1:
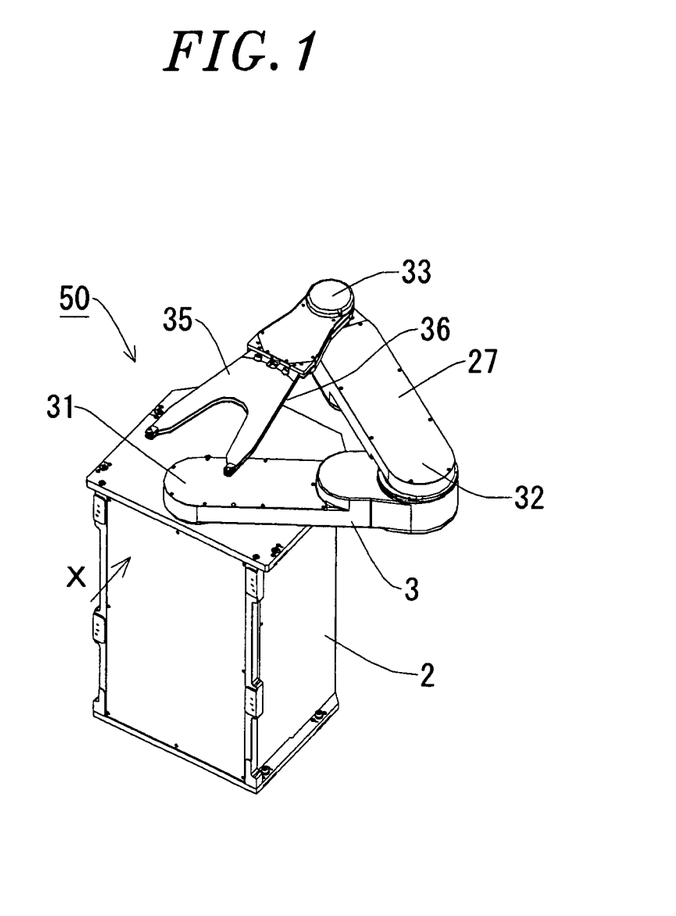
FIG. 1 is a perspective view showing a horizontal articulated robot in accordance with an embodiment of the present invention.
Figure 2:
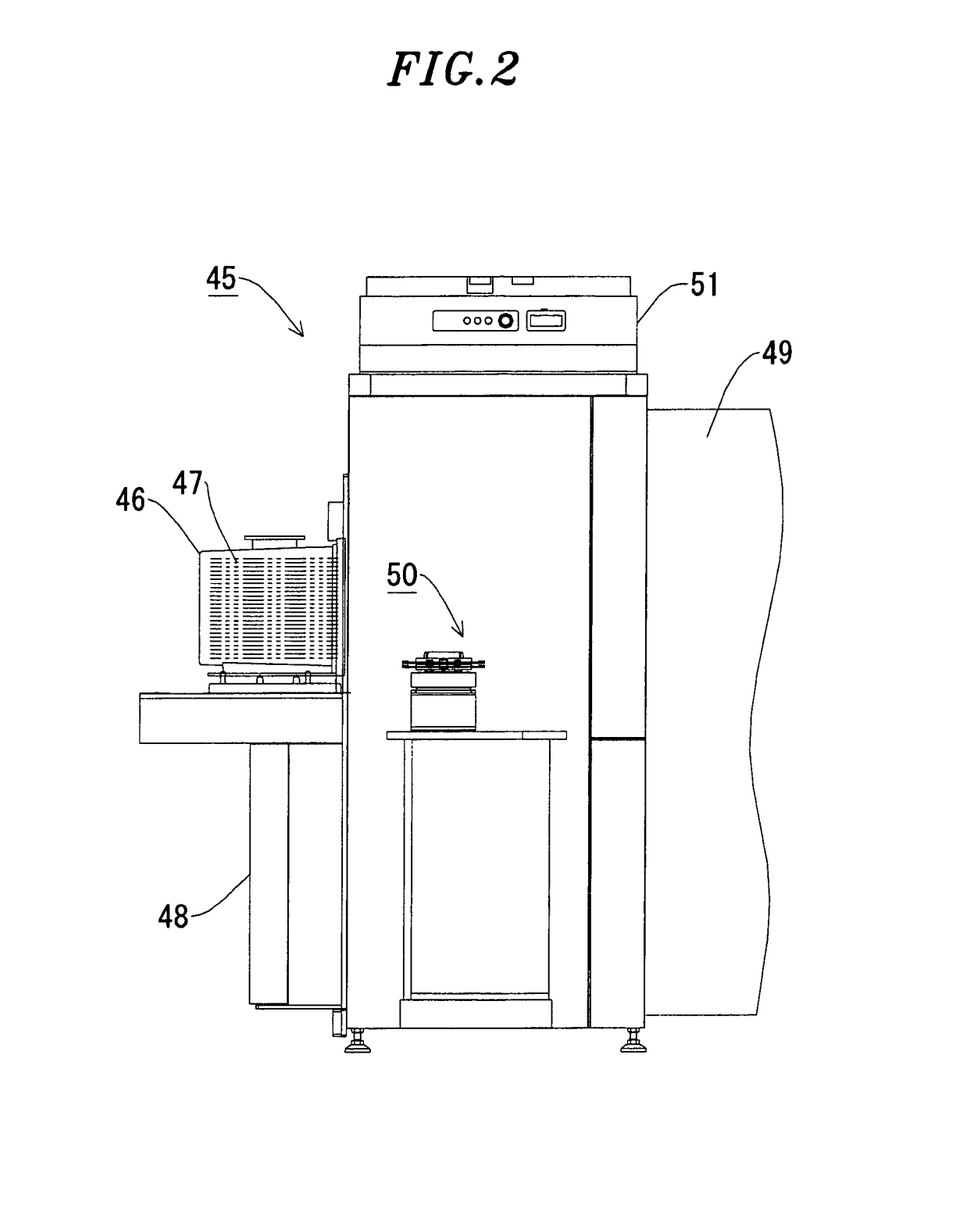
FIG. 2 is a side view showing a substrate transfer system provided with the horizontal articulated robot.

FIG. 1 is a perspective view showing a horizontal articulated robot 50 in accordance with one embodiment of the present invention. FIG. 2 is a side view showing a substrate transfer system 45 provided with the horizontal articulated robot 50 in accordance with the embodiment of the present invention. Referring to FIG. 2, the horizontal articulated robot 50 is installed in, e.g., a substrate transfer system 45, and used in transferring substrates 47. The substrate transfer system 45 is installed side by side with a processing apparatus 49 for subjecting a substrate to such processing as washing, etching, ashing, chemical vapor deposition and exposing.

The substrate transfer system 45 has an internal space within which the horizontal articulated robot 50 is arranged. A fan filter unit (FFU) 51 is mounted to the top of the substrate transfer system 45 to ensure that the internal space can be filled with a clean gas. Since the horizontal articulated robot 50 is arranged within the internal space, there is a need to broaden the operation range thereof by making the individual arms or the entire arm assembly compact. A cassette stage 48 is arranged at the outer wall of the substrate transfer system 45. The cassette stage 48 is a mechanism for supporting a cassette 46 that contains a plurality of substrates 47 therein.

The horizontal articulated robot 50 serves to replace the substrates 47 with respect to the cassette 46 or to transfer the substrates 47 between the cassette 46 and the processing apparatus 49. The substrate transfer system 45 shown in FIG. 2 is nothing more than one example. The horizontal articulated robot 50 may be installed in many different places within the semiconductor manufacturing apparatus to transfer the substrates 47 between desired positions.

As shown in FIG. 1, the horizontal articulated robot 50 includes a body 2 serving as a base. A first arm 3 is supported on a top portion of the body 2 to be rotatable about a first joint 31. The base end portion of a second arm 27 is supported on a tip end portion of the first arm 3 to be rotatable about a second joint 32. Base end portions of first and second forks 36 and 35 are supported on a tip end portion of the second arm 27 to be rotatable about a third joint 33. The first and second forks 36 and 35 are capable of holding the substrates 47.

In the present embodiment, the horizontal articulated robot 50 includes two forks, i.e., the first and second forks 36 and 35. The two forks 36 and 35 can be used in the processing apparatus 49 to, e.g., transfer unprocessed substrates 47 and processed substrates 47, respectively. Use of the two forks 36 and 35 helps increase the number of substrates 47 transferred per unit hour.

The first and second forks 36 and 35 are independently rotatable about the common third joint 33. Further, the first arm 3 and the second arm 27 are independently rotatable on horizontal planes. The detailed configuration for realizing such rotation will be described later. The horizontal articulated robot 50 transfers the substrates 47 placed on the first and second forks 36 and 35 between desired positions by causing the first arm 3, the second arm 27, the first fork 36 and the second fork 35 to rotate relative to each other.

Figure 3A:
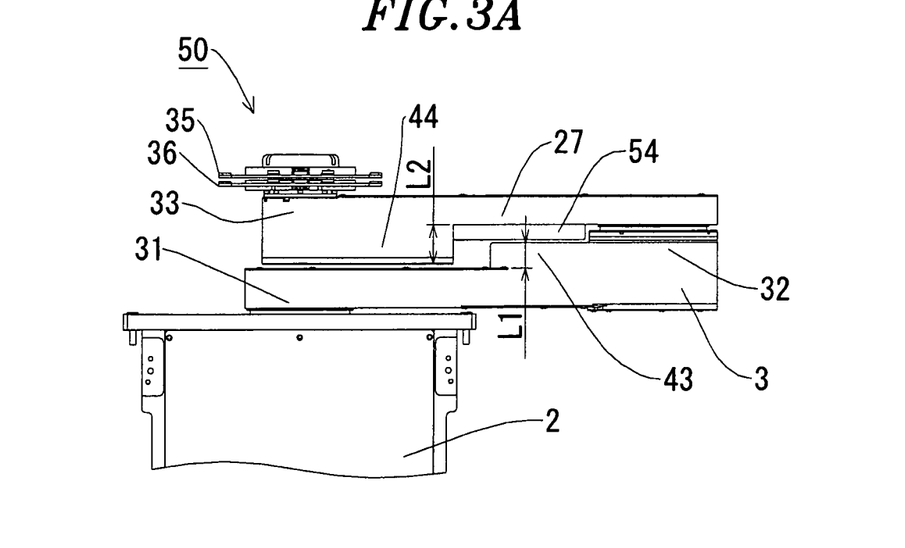
FIGS. 3A through 3C are views illustrating arms employed in the horizontal articulated robot.
Figure 3B:
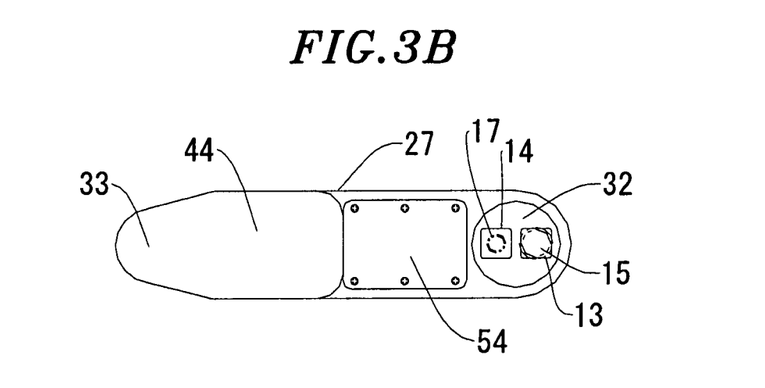
Figure 3C:
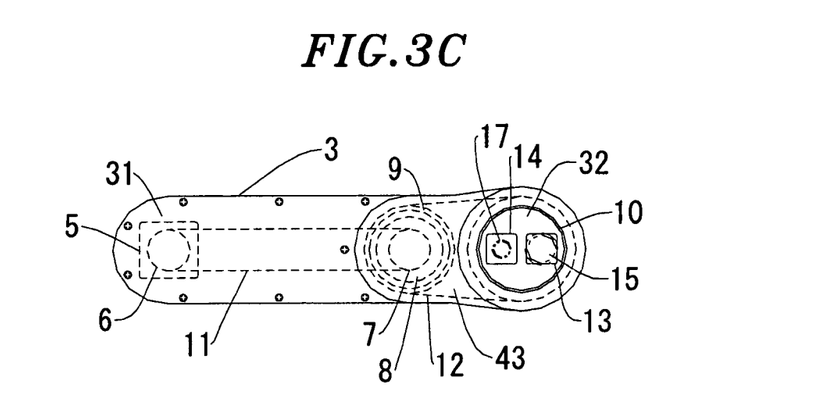

FIGS. 3A through 3C are views illustrating the arms of the horizontal articulated robot. FIG. 3A is a side view available when the horizontal articulated robot 50 is observed in the direction X in FIG. 1, showing the first arm 3 and the second arm 27 kept in an overlapping state as seen from above. FIG. 3B is a bottom view showing only the second arm 27 as seen from below in FIG. 3A. FIG. 3C is a top view showing only the first arm 3 as seen from above in FIG. 3A. In case of the present embodiment, the link length of the first arm 3 from the first joint 31 to the second joint 32 is substantially equal to that of the second arm 27 from the second joint 32 to the third joint 33.

As is apparent in FIG. 3A, the first arm 3 includes a first enlarged portion 43 formed in a tip end portion thereof, the first enlarged portion 43 having an upper surface positioned higher than the upper surface of the base end portion of the first arm 3. The first enlarged portion encompasses the second joint 32 but does not encompass the first joint 31. The second arm 27 includes a second enlarged portion 44 formed in a tip end portion thereof, the second enlarged portion 44 having a lower surface positioned lower than the lower surface of the base end portion of the second arm 27. The second enlarged portion 44 encompasses the third joint 33 but does not encompass the second joint 32. The first enlarged portion 43 and the second enlarged portion 44 are at least partially overlapped with each other horizontally. That is, the first enlarged portion 43 and the second enlarged portion 44 are arranged partially at a same height.

As will be set forth later in more detail, a lower cable cover 54 is attached to the lower surface of the second arm 27 in the present embodiment. In view of this, the protrusion height L1 of the first enlarged portion 43 from the upper surface of the base end portion of the first arm 3 is set such that the first enlarged portion 43 does not make contact with the lower cable cover 54. Similarly, the protrusion height L2 of the second enlarged portion 44 from the lower surface of the base end portion of the second arm 27 is set such that the second enlarged portion 44 does not make contact with the upper surface of the base end portion of the first arm 3. As shown in FIGS. 3B and 3C, the first enlarged portion and the second enlarged portion and 44 are shaped not to make contact with each other when seen in a plan view.

Therefore, even if the second arm 27 rotates about the second joint 32 with respect to the first arm 3, there is no possibility that the first and second enlarged portions 43 and 44 come into contact with each other. As will be described below, the first and second enlarged portions 43 and 44 configured as above are capable of accommodating the drive power sources and the transmission mechanisms for driving the second arm 27, the first fork 36 and the second fork 35. This contributes to the size reduction of the first arm 3 and the second arm 27. Moreover, this helps improve the operability of the arms as compared with the conventional configuration in which all the drive power sources and the transmission mechanisms are arranged within the body.

Next, the internal configurations of the body 2, the first arm 3 and the second arm 27 of the horizontal articulated robot 50 will be described in detail.

Figure 4:
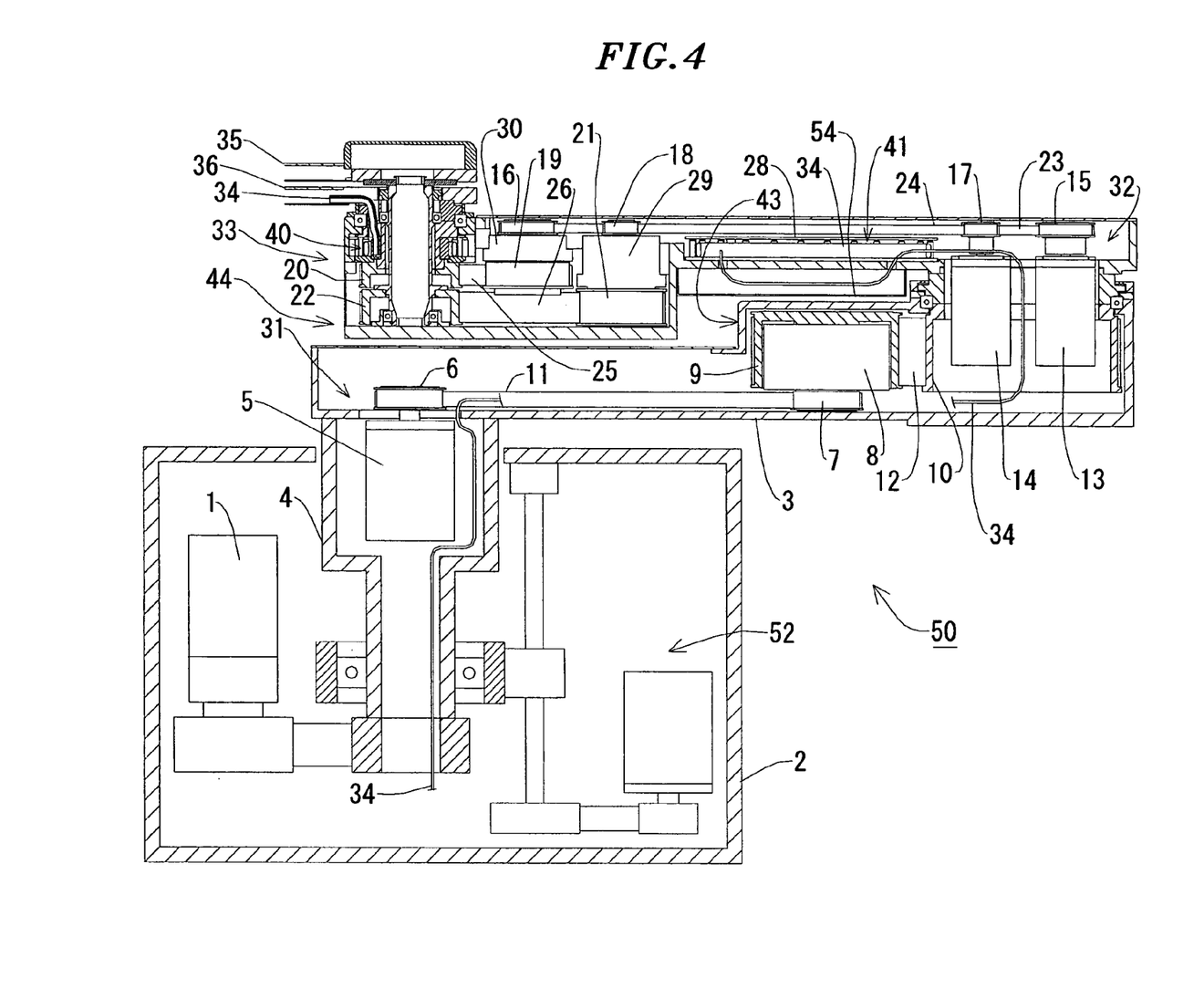
FIG. 4 is a section view showing the horizontal articulated robot.

The internal configuration of the body 2 will be first described with reference to FIG. 4, which is a section view showing the horizontal articulated robot 50. In the present embodiment, the body 2 has a box-like shape. A first arm drive motor 1 is arranged within the body 2. If necessary, a speed reducer may be attached to the output end portion of the first arm drive motor 1. The first arm drive motor 1 rotates a first arm drive shaft 4 through a belt and pulleys. The tip end extension of the first arm drive shaft 4 protrudes upwards beyond the upper surface of the body 2. The first arm drive shaft 4 is secured at its upper end to the lower surface of the base end portion of the first arm 3.

With this configuration, the first arm drive motor 1 causes the first arm 3 to rotate about the first joint 31. It is sometimes the case that a lift mechanism 52 is arranged within the body 2. The lift mechanism 52 is a mechanism for lifting and lowering the first arm drive shaft 4. In the present embodiment, the lift mechanism 52 is of the type including a motor and a ball screw. Any conventional lift mechanism may be used as the lift mechanism 52.

Next, the internal configuration of the first arm 3 will be described with reference to FIG. 4. A second arm drive motor 5, serving as a drive power source of the second arm 27, is fixed to the lower surface of base end portion of the first arm 3. The first arm drive shaft 4 mentioned above is formed into a hollow cylinder shape to accommodate the second arm drive motor 5 in the upper internal space thereof. The second arm drive motor 5 includes a frame arranged in such a position as to come into the body 2 and a rotation shaft whose tip end portion protruding into the first arm 3. A first joint pulley 6 is fixed to the tip end portion of the rotation shaft of the second arm drive motor 5. Thus, the first joint pulley 6 is rotated by the second arm drive motor 5.

Inasmuch as the frame of the second arm drive motor 5 is substantially accommodated inside the body 2, it is possible to reduce the thickness of the base end portion of the first arm 3. Moreover, since the second arm drive motor 5 is positioned within the first arm drive shaft 4, there is no possibility that fine dust generated near the rotation shaft of the second arm drive motor 5 leaks to the outside. A first belt 11 is wound around the first joint pulley 6.

The first belt 11 is stretched to the tip end portion of the first arm 3 and wound around a second-arm-driving-reducer input pulley 7 within the first arm 3. Thus, the first joint pulley 6 and the second-arm-driving-reducer input pulley 7 are rotated together by the first belt 11. The second-arm-driving-reducer input pulley 7 is arranged below a second-arm-driving reducer 8 so that the rotation of the second-arm-driving-reducer input pulley 7 can be inputted into the second-arm-driving reducer 8.

With this configuration, the first joint pulley 6, the second-arm-driving-reducer input pulley 7 and the second-arm-driving reducer 8 are arranged near the bottom portion of the first arm 3 in the first arm 3. Since the first arm 3 may be formed to enclose only the first joint pulley 6 and the first belt 11 in the space near the base end portion thereof, it is possible to reduce the thickness of the base end portion of the first arm 3. The second-arm-driving reducer 8 has a specified reduction ratio and reduces the rotational speed of the second-arm-driving-reducer input pulley 7.

A second-arm-driving-reducer output pulley 9 is arranged to cover the outer circumferential surface and the upper surface of the second-arm-driving reducer 8. The second-arm-driving-reducer output pulley 9 is fixed to the output shaft of the second-arm-driving reducer 8. The second-arm-driving-reducer output pulley 9, the output shaft of the second-arm-driving reducer 8 and the second-arm-driving-reducer input pulley 7 are arranged in a coaxial relationship with one another. The second-arm-driving-reducer output pulley 9 is formed into a cup shape to enclose the second-arm-driving reducer 8. Belt teeth are formed on the cylinder portion of the second-arm-driving-reducer output pulley 9 covering the outer circumferential surface of the second-arm-driving reducer 8, the belt teeth meshing with a second belt 12.

The second belt 12 is wound around the cylinder portion of the second-arm-driving-reducer output pulley 9 and a second joint pulley 10. The second joint pulley 10 is arranged within the tip end portion of the first arm 3 and fixed at its upper end to the lower surface of the base end portion of the second arm 27.

Thus, the rotation of the second arm drive motor 5 is inputted to the second-arm-driving reducer 8 through the first joint pulley 6, the first belt 11 and the second-arm-driving-reducer input pulley 7. The second-arm-driving reducer 8 outputs low-speed rotation to rotate the second arm 27 through the second-arm-driving-reducer output pulley 9, the second belt 12 and the second joint pulley 10.

In the present embodiment described above, the second arm drive motor 5 and the second-arm-driving reducer 8 are arranged in a spaced-apart relationship with each other. Likewise, the second-arm-driving-reducer output pulley 9 and the second joint pulley 10 are arranged within the first arm in a spaced-apart relationship with each other. The distance between the first joint pulley 6 and the second-arm-driving-reducer input pulley 7 is set greater than the distance between the second-arm-driving-reducer output pulley 9 and the second joint pulley 10. The first enlarged portion 43 is formed in the tip end portion of the first arm 3 to accommodate the second-arm-driving-reducer input pulley 7, the second-arm-driving reducer 8, the second-arm-driving-reducer output pulley 9, the second belt 12 and the second joint pulley 10 therein.

With such configurations, the base end portion of the first arm 3 can be made thin because the second arm drive motor 5 is positioned near the base end portion of the first arm 3 and accommodated within the body 2. It is also possible to reduce the protrusion dimension of the first enlarged portion 43, i.e., the thickness of the tip end portion of the first arm 3, because the second-arm-driving reducer 8 and the second joint pulley 10, are arranged spaced apart from each other in the longitudinal direction of the first arm 3 within the tip end portion of the first arm 3. By forming the second-arm-driving-reducer output pulley 9 into a cup shape and arranging it as in the present embodiment, the first enlarged portion 43 can be formed to have as small a volume as possible.

Since the second-arm-driving reducer 8 is arranged in proximity to the second joint 32 while the second arm drive motor 5 is positioned near the base end portion of the first arm 3, the output shaft of the second-arm-driving reducer 8 adjoins the base end portion of the second arm 27. This assists in shortening the second belt 12 and keeping the drive power source and the driven object close. Therefore, it is less likely that the operability of the second arm 27 is impaired by the second belt 12.

In the present embodiment, the first belt 11 is smaller in width than the second belt 12. The first joint pulley 6, the first belt 11 and the second-arm-driving-reducer input pulley 7 rotate at substantially the same rotational speed as that of the rotation shaft of the second arm drive motor 5. On the other hand, the second-arm-driving-reducer output pulley 9, the second joint pulley 10 and the second belt 12 rotate at the rotational speed reduced by the second-arm-driving reducer 8.

In other words, the first belt 11 has a length greater than that of the second belt 12 and moves faster than the second belt 12. Thus, the first belt 11 is low in rigidity. In contrast, the second belt 12 wound around the outer circumferential surface of the second-arm-driving-reducer output pulley 9 covering the second-arm-driving reducer 8 is greater in width, but smaller in length, than the first belt 11. Thus, the second belt 12 is high in rigidity and is capable of improving the operability of the second arm 27.

Figure 5:
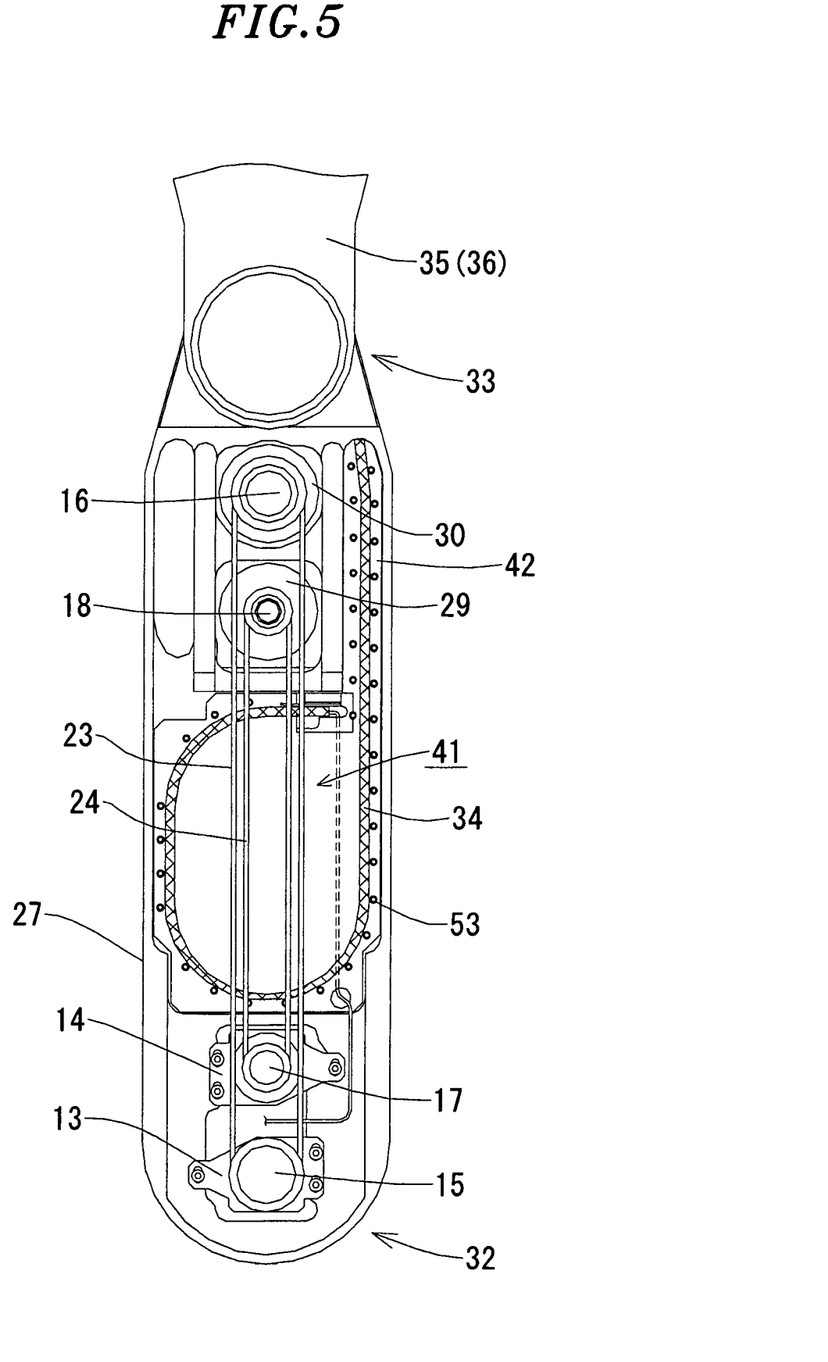
FIG. 5 is a plan view illustrating a second arm employed in the horizontal articulated robot shown in FIG. 4.

Next, the internal configuration of the second arm 27 will be described with reference to FIGS. 4 and 5. FIG. 5 is a top view illustrating the second arm 27 employed in the horizontal articulated robot 50 shown in FIG. 4. As shown in FIG. 4, the second joint pulley 10 is formed into a cylindrical shape. The second joint pulley 10 is fixed at its upper end to the lower surface of the base end portion of the second arm 27. A first-fork-driving motor 13 and a second-fork-driving motor 14 are arranged within the second joint pulley 10.

The first-fork-driving motor 13 and the second-fork-driving motor 14 respectively serve as drive power sources of the first fork 36 and the second fork 35. The lower extensions of the frames of the first-fork-driving motor 13 and the second-fork-driving motor 14 are accommodated within the second joint pulley 10. The upper extensions of the frames and the rotation shafts of the first-fork-driving motor 13 and the second-fork-driving motor 14 are arranged to protrude into the inside of the base end portion of the second arm 27. A first-fork-driving pulley 15 is fixed to the rotation shaft of the first-fork-driving motor 13. A second-fork-driving pulley 17 is fixed to the rotation shaft of the second-fork-driving motor 14.

Referring to FIG. 5, the first-fork-driving motor 13 and the second-fork-driving motor 14 are arranged side by side along the longitudinal direction of the second arm 27. The first-fork-driving pulley 15 is greater in pulley diameter than the second-fork-driving pulley 17. A first-fork-driving input belt 23 and a second-fork-driving input belt 24 are respectively wound around the first-fork-driving pulley 15 and the second-fork-driving pulley 17. The first-fork-driving input belt 23 and the second-fork-driving input belt 24 are stretched to the tip end portion of the second arm 27.

A second-fork-driving-reducer input pulley 18 and a first-fork-driving-reducer input pulley 16 are arranged in the named order from the side closer to the second joint 32. The second-fork-driving input belt 24 and the first-fork-driving input belt 23 are wound around the second-fork-driving-reducer input pulley 18 and the first-fork-driving-reducer input pulley 16, respectively. The second-fork-driving-reducer input pulley 18 has a pulley diameter equal to that of the second-fork-driving pulley 17. The first-fork-driving-reducer input pulley 16 has a pulley diameter equal to that of the first-fork-driving pulley 15.

Accordingly, the first-fork-driving input belt 23 and the second-fork-driving input belt 24 are stretched parallel to each other along the longitudinal direction of the second arm 27. As shown in FIG. 4, the first-fork-driving pulley 15 and the first-fork-driving-reducer input pulley 16, and the second-fork-driving pulley 17 and the second-fork-driving-reducer input pulley 18 are at least partially overlapped with each other horizontally. That is, the first-fork-driving pulley 15 and the first-fork-driving-reducer input pulley 16, and the second-fork-driving pulley 17 and the second-fork-driving-reducer input pulley 18 are arranged partially at a same height.

In the present embodiment, the first-fork-driving pulley 15, the first-fork-driving-reducer input pulley 16, the second-fork-driving pulley 17 and the second-fork-driving-reducer input pulley 18 are arranged substantially at the same height. Referring to FIG. 5, the second-fork-driving pulley 17, the second-fork-driving input belt 24 and the second-fork-driving-reducer input pulley 18 are arranged in the space surrounded by the first-fork-driving pulley 15, the first-fork-driving input belt 23 and the first-fork-driving-reducer input pulley 16, when seen in a plan view. These configurations contribute to the thickness reduction of the second arm 27.

Referring back to FIG. 4, a second-fork-driving reducer 29 is arranged below the second-fork-driving-reducer input pulley 18. The second-fork-driving-reducer input pulley 18 is fixed to the input shaft of the second-fork-driving reducer 29 so that the rotation of the second-fork-driving-reducer input pulley 18 can be inputted to the second-fork-driving reducer 29. Similarly, a first-fork-driving reducer 30 is arranged below the first-fork-driving-reducer input pulley 16. The first-fork-driving-reducer input pulley 16 is fixed to the input shaft of the first-fork-driving reducer 30 so that the rotation of the first-fork-driving-reducer input pulley 16 can be inputted to the first-fork-driving reducer 30.

A second-fork-driving-reducer output pulley 21 is arranged below the second-fork-driving reducer 29 and fixed to the output shaft of the second-fork-driving reducer 29. A first-fork-driving-reducer output pulley 19 is arranged below the first-fork-driving reducer 30 and fixed to the output shaft of the first-fork-driving reducer 30. The first-fork-driving-reducer output pulley 19 and the second-fork-driving-reducer output pulley 21 are arranged at different heights so that the first-fork-driving-reducer output pulley 19 can rotate in a higher position than the second-fork-driving-reducer output pulley 21. A second-fork-driving output belt 26 and a first-fork-driving output belt 25 are respectively wound around the second-fork-driving-reducer output pulley 21 and the first-fork-driving-reducer output pulley 19.

In the meantime, a second-fork-driving third joint pulley 22 is arranged within the tip end portion of the second arm 27 and connected to the base end portion of the second fork 35. The second-fork-driving third joint pulley is arranged at the same height as the second-fork-driving-reducer output pulley 21. The second-fork-driving output belt 26 is wound around the second-fork-driving third joint pulley 22 and the second-fork-driving-reducer output pulley 21. Similarly, a first-fork-driving third joint pulley 20 is arranged within the tip end portion of the second arm 27 and connected to the base end portion of the first fork 36. The first-fork-driving third joint pulley 20 is arranged at the same height as the first-fork-driving-reducer output pulley 19. The first-fork-driving output belt 25 is wound around the first-fork-driving third joint pulley 20 and the first-fork-driving-reducer output pulley 19.

Accordingly, the rotation of the second-fork-driving motor 14 is inputted to the second-fork-driving reducer 29 through the second-fork-driving pulley 17, the second-fork-driving input belt 24 and the second-fork-driving-reducer input pulley 18. The second-fork-driving reducer 29 outputs low-speed rotation to rotate the second fork 35 through the second-fork-driving-reducer output pulley 21, the second-fork-driving output belt 26 and the second-fork-driving third joint pulley 22. Similarly, the rotation of the first-fork-driving motor 13 is inputted to the first-fork-driving reducer 30 through the first-fork-driving pulley 15, the first-fork-driving input belt 23 and the first-fork-driving-reducer input pulley 16. The first-fork-driving reducer 30 outputs low-speed rotation to rotate the first fork 36 through the first-fork-driving-reducer output pulley 19, the first-fork-driving output belt 25 and the first-fork-driving third joint pulley 20.

In the present embodiment described above, the first-fork-driving motor 13 and the second-fork-driving motor 14, and the first-fork-driving reducer 30 and the second-fork-driving reducer 29 are respectively arranged in a spaced-apart relationship with each other within the second arm 27. The distance between the second-fork-driving pulley 17 and the second-fork-driving-reducer input pulley 18 (or the distance between the first-fork-driving pulley 15 and the first-fork-driving-reducer input pulley 16) is set greater than the distance between the second-fork-driving-reducer output pulley 21 and the second-fork-driving third joint pulley 22 (or the distance between the first-fork-driving-reducer output pulley 19 and the first-fork-driving third joint pulley 20).

The second enlarged portion 44 is formed in the tip end portion of the second arm 27 to accommodate the second-fork-driving-reducer input pulley 18, the first-fork-driving-reducer input pulley 16, the second-fork-driving reducer 29, the first-fork-driving reducer 30, the second-fork-driving-reducer output pulley 21, the first-fork-driving-reducer output pulley 19, the first-fork-driving output belt 25, the second-fork-driving output belt 26, the first-fork-driving third joint pulley 20 and the second-fork-driving third joint pulley 22 therein.

With such configurations, the base end portion of the second arm 27 can be made thin because the first-fork-driving motor 13 and the second-fork-driving motor 14 are positioned near the base end portion of the second arm 27 and because the frames of the first-fork-driving motor 13 and the second-fork-driving motor 14 are partially accommodated within the second joint pulley 10. It is also possible to reduce the protrusion dimension of the second enlarged portion 44, i.e., the thickness of the tip end portion of the second arm 27, because the second-fork-driving reducer 29 and the second-fork-driving third joint pulley 22 (or the first-fork-driving reducer 30 and the first-fork-driving third joint pulley 20) are arranged spaced apart from each other in the longitudinal direction of the second arm 27 within the tip end portion of the second arm 27. This makes it possible to form the second enlarged portion 44 to have as small a volume as possible.

Since the second-fork-driving reducer 29 and the first-fork-driving reducer 30 are arranged in proximity to the third joint 33 while the first-fork-driving motor 13 and the second-fork-driving motor 14 are positioned near the base end portion of the second arm 27, the output shafts of the second-fork-driving reducer 29 and the first-fork-driving reducer 30 adjoin the base end portions of the second fork 35 and the first fork 36. This assists in shortening the first-fork-driving output belt 25 and the second-fork-driving output belt 26 and keeping the drive power sources and the driven objects close. Therefore, it is less likely that the operability of the second fork 35 and the first fork 36 is impaired by the belts 25 and 26.

In the present embodiment, the first-fork-driving input belt 23 and the second-fork-driving input belt 24 are smaller in width than the first-fork-driving output belt 25 and the second-fork-driving output belt 26. The first-fork-driving pulley 15, the first-fork-driving input belt 23 and the first-fork-driving-reducer input pulley 16 rotate at substantially the same rotational speed as that of the first-fork-driving motor 13. Likewise, the second-fork-driving pulley 17, the second-fork-driving input belt 24 and the second-fork-driving-reducer input pulley 18 rotate at the substantially same rotational speed as that of the second-fork-driving motor 14.

On the other hand, the second-fork-driving-reducer output pulley 21, the second-fork-driving output belt 26 and the second-fork-driving third joint pulley 22 rotate at the rotational speed reduced by the second-fork-driving reducer 29. Likewise, the first-fork-driving-reducer output pulley 19, the first-fork-driving output belt 25 and the first-fork-driving third joint pulley 20 rotate at the rotational speed reduced by the first-fork-driving reducer 30. In other words, the first-fork-driving input belt 23 and the second-fork-driving input belt 24 respectively have lengths greater than those of the first-fork-driving output belt 25 and the second-fork-driving output belt 26 and move faster than the first-fork-driving output belt 25 and the second-fork-driving output belt 26.

Thus, the first-fork-driving input belt 23 and the second-fork-driving input belt 24 are low in rigidity. In contrast, the first-fork-driving output belt 25 and the second-fork-driving output belt 26 are respectively greater in width, but smaller in length, than the first-fork-driving input belt 23 and the second-fork-driving input belt 24. Thus, the first-fork-driving output belt 25 and the second-fork-driving output belt 26 are high in rigidity and are capable of improving the operability of the first fork 36 and the second fork 35.

In the present embodiment in which a plurality of forks is provided in the tip end portion of the second arm 27, the first-fork-driving pulley 15 and the first-fork-driving-reducer input pulley 16, and the second-fork-driving pulley 17 and the second-fork-driving-reducer input pulley are at least partially overlapped with each other horizontally. That is, the first-fork-driving pulley 15 and the first-fork-driving-reducer input pulley 16, and the second-fork-driving pulley 17 and the second-fork-driving-reducer input pulley 18 are arranged partially at a same height.

When seen in a plan view, the second-fork-driving pulley 17, the second-fork-driving input belt 24 and the second-fork-driving-reducer input pulley 18 are arranged in the space surrounded by the first-fork-driving pulley 15, the first-fork-driving input belt 23 and the first-fork-driving-reducer input pulley 16. Therefore, it is possible to suppress an increase in thickness of the second arm 27 even if the second arm 27 is provided with a plurality of forks.

Fork cables 34 arranged to extend to the second fork 35 or the first fork 36 will now be described in detail. In the present embodiment, the second fork 35 and the first fork 36 hold the substrate 47 by virtue of an attraction force, although they may sometimes hold the substrate 47 with a frictional force. Alternatively, the second fork 35 and the first fork 36b may hold the substrate 47 in a mechanical manner. It is often the case that each of the second fork 35 and the first fork 36 are equipped with a sensor for detecting the presence or absence of the substrate 47 or a sensor for detecting the positions of the substrate 47 contained in the cassette 46.

In view of this, it is necessary that a gas supplying tube, an electric wire and other lines for generating an attraction force or a gripping force be installed to extend from the body 2 to each of the second fork 35 and the first fork 36 via the internal spaces of the first arm 3 and the second arm 27. For the sake of convenience in description, they will be collectively referred to as "fork cables 34". Since the fork cables 34 are arranged to extend to each of the second fork 35 and the first fork 36, the movement of the second fork 35 or the first fork 36 should not be hindered by the fork cables 34 even when the second fork 35 or the first fork 36 rotates about the third joint 33. Moreover, the fork cables 34 should not hinder the operation of the devices existing within the second arms.

In the present embodiment, it is assumed that the second fork 35 and the first fork 36 need the fork cables 34. Under this assumption, description will be made on the arranging configuration of the fork cables 34 by which the fork cables 34 can be appropriately arranged while keeping the arms small in size. However, there may be a case where there is no need to arrange the fork cables 34 by nature. In this case, it is not necessary to employ the arranging configuration of the fork cables 34 to be described below.

The arranging configuration of the fork cables 34 employed in the present embodiment will be described hereinafter with reference to FIGS. 4 and 5. The fork cables 34 are arranged to extend from the body 2 to each of the second fork 35 and the first fork 36 through the internal spaces of the first arm 3 and the second arm 27. The base end portions of the fork cables 34 are connected to a controller unit (not shown) or a fluid source (not shown) of the horizontal articulated robot 50 provided inside or outside the body 2.

The fork cables 34 are first arranged to extend into the first arm 3 through the first arm drive shaft 4. Within the first arm 3, the fork cables 34 run along the first belt 11 and extend toward the tip end portion of the first arm 3. In the tip end portion of the first arm 3, the fork cables 34 extend into the second arm 27 through the internal space of the second joint pulley 10. In the vicinity of the first-fork-driving motor 13 and the second-fork-driving motor 14, the fork cables 34 extend through the inner bottom surface of the second arm 27 to the lower surface of the second arm 27. The lower cable cover 54 provided on the lower surface of the second arm 27 encloses the fork cables 34 extending along the lower surface of the second arm 27.

The lower cable cover 54 is arranged on the lower surface of the second arm 27 at the side of the base end portion of the second arm 27 with respect to the second enlarged portion 44 and is positioned between the second enlarged portion 44 and the second joint 32. The fork cables 34 accommodated within the lower cable cover 54 extend toward the tip end portion of the second arm 27 through the internal space of the lower cable cover 54. Then, the fork cables 34 extend back into a cable release space 41 defined inside the second arm 27 at a position near the second-fork-driving reducer 29 and the first-fork-driving reducer 30.

The cable release space 41 is defined below the first-fork-driving input belt 23 extending between the first-fork-driving pulley 15 and the first-fork-driving-reducer input pulley 16 and below the second-fork-driving input belt 24 extending between the second-fork-driving pulley 17 and the second-fork-driving-reducer input pulley 18. A partition plate 28 for covering the fork cables 34 is arranged above the cable release space 41, i.e., immediately below the first-fork-driving input belt 23 and the second-fork-driving input belt 24.

The reason for providing the partition plate 28 is to prevent the fork cables 34 from making contact with the first-fork-driving input belt 23 or the second-fork-driving input belt 24 when the fork cables 34 move in the below-mentioned manner. The fork cables 34 are arranged within the cable release space 41 so that they can be positioned at the side of the base end portion of the second arm 27 with respect to the second-fork-driving reducer 29 or the first-fork-driving reducer 30. A multiple number of rolling members 53 are arranged along the periphery of the cable release space 41.

In the present embodiment, each of the rolling members 53 includes a roller having a vertical rotation shaft. When the fork cables 34 move in the below-mentioned manner, the rolling members 53 come into contact with the fork cables 34 and make rolling movement, thereby facilitating the movement of the fork cables 34. The fork cables 34 extending into the cable release space 41 are arranged to run along the periphery of the cable release space 41 through the base end side of the second arm 27 in the cable release space 41 so that they can describe a loop without being fixed in the cable release space 41. Then, the fork cables 34 extend toward the tip end portion of the second arm 27 along the longitudinal direction of the second arm 27.

At one side of the second-fork-driving reducer 29 and the first-fork-driving reducer 30 within the second arm 27, a cable passage 42 is defined to extend along the longitudinal direction of the second arm 27. The fork cables 34 extend toward the third joint 33 through the cable passage 42. A multiple number of rolling members 53 are also arranged along the cable passage 42. A winding unit 40 is provided in each of the base end portions of the second fork 35 and the first fork 36.

The fork cables 34 are wound around each winding unit 40 and connected to an attraction mechanism (not shown) or a sensor (not shown) provided in each of the second fork 35 and the first fork 36. In the drawings, only one winding unit 40 is shown for the convenience of illustration.

Figure 6A:
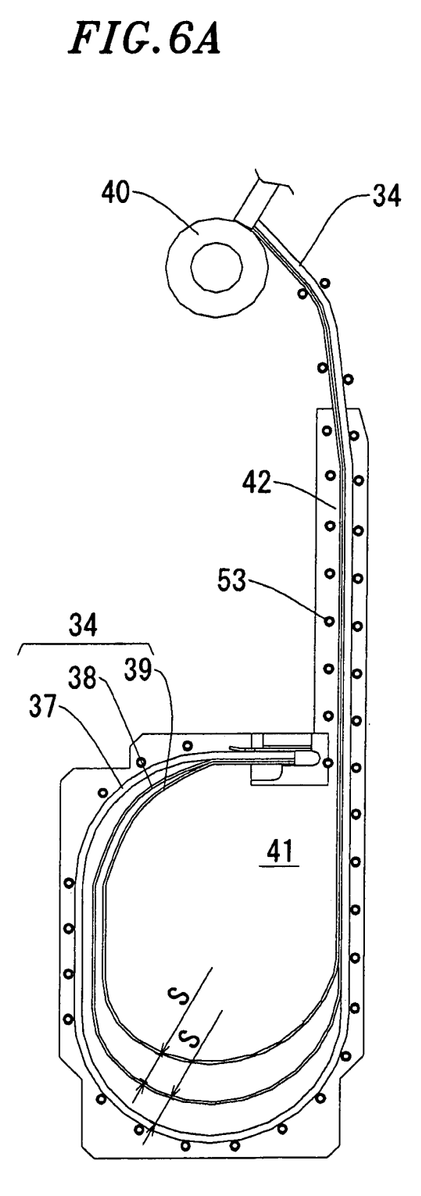
FIGS. 6A and 6B are partial top views depicting the movement of fork cables in a cable release space illustrated in FIG. 5.
Figure 6B:
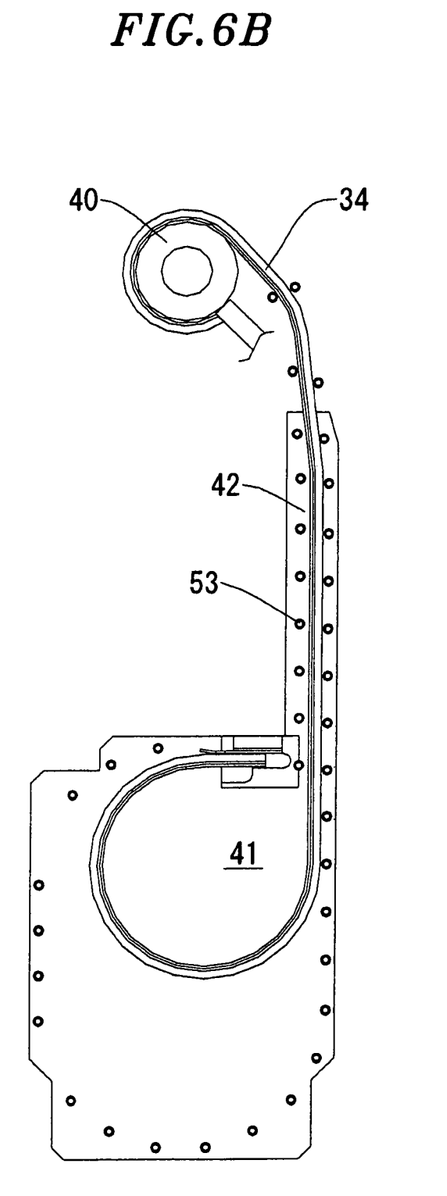

The movement of the fork cables 34, for the first fork 36 as an example, arranged and configured as above will now be described with reference to FIGS. 6A and 6B, which are partial top views depicting the movement of the fork cables 34 in the cable release space 41 illustrated in FIG. 5. FIGS. 6B and 6A respectively depict the posture of the fork cables 34 in the cable release space 41 in the case where the first fork 36 is rotated in one (first) direction and the other (second) direction.

In the present embodiment, the fork cables 34 include a plurality of flat tubes or cables, e.g., a flat tube 37, a flat cable 38 and a flat cable 39, as shown in FIG. 6A. The flat tube 37 is a flat-tied bundle of fluid tubes for the first fork 36. The flat cable 38 is a flat-tied bundle of electric wires connected to the devices provided in the first fork 36. The flat cable 39 is another flat-tied bundle of electric wires connected to the devices provided in the first fork 36.

The flat tube 37, the flat cable 38 and the flat cable 39 are not tied together at least in the cable release space 10. 41 and are arranged so that gaps can be generated between them when the first fork 36 is in the middle position of its rotational movement extent with respect to the second arm 27. If the first fork 36 rotates about the third joint 33 in the first direction as shown in FIG. 6B, the fork cables 34 are moved forward through the cable passage 42 and wound around the winding unit 40.

At this time, the flat tube 37, the flat cable 38 and the flat cable 39 are kept in contact with one another with no gap and united together to form a relatively small loop in the cable release space 41. If the first fork 36 rotates about the third joint 33 in the second direction as shown in FIG. 6A, the fork cables 34 wound around the winding unit 40 are moved backward through the cable passage 42 and loosened in the cable release space 41.

At this time, the flat tube 37, the flat cable 38 and the flat cable 39 are expanded outwards within the cable release space 41 while forming gaps S greater than the gaps formed when the first fork 36 is in the middle position. By allowing the gaps to be formed between the flat tube 37, the flat cable 38 and the flat cable 39, it is possible to prevent the flat tube 37, the flat cable 38 and the flat cable 39 from being entangled with one another, which assures smooth movement of the fork cables 34.

The movement of the fork cables 34 for the second fork 35 is substantially the same as that of the fork cables 34 for the first fork 36. Therefore, redundant description thereof will be omitted.

With the arranging configuration of the fork cables 34 of the present embodiment described above, the cable release space 41 is defined below the first-fork-driving input belt 23 extending between the first-fork-driving pulley 15 and the first-fork-driving-reducer input pulley 16 and below the second-fork-driving input belt 24 extending between the second-fork-driving pulley 17 and the second-fork-driving-reducer input pulley 18. This makes it possible to arrange the fork cables 34 without hindering the operation of the second fork 35 and the first fork 36 while reducing the thickness of the second arm 27 as far as possible.

In the present embodiment in which a plurality of forks, e.g., the second fork 35 and the first fork 36, is provided in the tip end portion of the second arm 27, the first-fork-driving pulley 15 and the first-fork-driving-reducer input pulley 16, and the second-fork-driving pulley 17 and the second-fork-driving-reducer input pulley 18 are at least partially overlapped with each other horizontally. That is, the first-fork-driving pulley 15 and the first-fork-driving-reducer input pulley 16, and the second-fork-driving pulley 17 and the second-fork-driving-reducer input pulley 18 are arranged partially at a same height.

Further, the second-fork-driving pulley 17, the second-fork-driving input belt 24 and the second-fork-driving-reducer input pulley 18 are arranged in the space surrounded by the first-fork-driving pulley 15, the first-fork-driving input belt 23 and the first-fork-driving-reducer input pulley 16. Therefore, it is possible to reduce the thickness of the second arm 27 even if the cable release space 41 is defined in the second arm 27.

As described above, it is possible in the present invention to reduce the total height of the first arm 3 and the second arm 27 by forming the first enlarged portion 43 and the second enlarged portion 44. Moreover, the configurations disclosed herein assist in reducing the thickness and size of each of the first arm 3 and the second arm 27. In addition, the positioning accuracy of the arms in the horizontal articulated robot 50 can be enhanced by improving the operability of the respective arms.

It should be appreciated that the embodiment disclosed herein is not limitative but illustrative in all respects. The present invention should be defined by the claims and not by the foregoing description of the embodiment. The present invention should be construed to include all changes or modifications equivalent in meaning and scope to the claims.

What is claimed is:

1. A horizontal articulated robot for use in transferring a substrate, comprising:
    a body;
    a first arm including a base end portion and a tip end portion, the base end portion of the first arm being supported by the body to be rotatable about a first joint;
    a second arm including a base end portion and a tip end portion, the base end portion of the second arm being supported by the tip end portion of the first arm to be rotatable about a second joint; and
    a fork for holding the substrate, the fork including a base end portion supported by the tip end portion of the second arm to be rotatable about a third joint,
    wherein the first arm includes a first enlarged portion formed in the tip end portion thereof, the first enlarged portion having an upper surface positioned higher than an upper surface of the base end portion of the first arm,
    wherein the second arm includes a second enlarged portion formed in the tip end portion thereof, the second enlarged portion having a lower surface positioned lower than a lower surface of the base end portion of the second arm,
    wherein the first enlarged portion and the second enlarged portion are at least partially overlapped with each other horizontally,
    wherein the robot further comprises:
    a second arm drive motor provided within the body to serve as a drive power source for rotating the second arm;
    a first joint pulley accommodated within the first arm and configured to be rotated by the second arm drive motor;
    a first belt wound around the first joint pulley;
    a second-arm-driving-reducer input pulley configured to be rotated together with the first joint pulley by the first belt;
    a second-arm-driving reducer to which the rotation of the second-arm-driving-reducer input pulley is inputted;
    a second-arm-driving-reducer output pulley provided to an output shaft of the second-arm-driving reducer;
    a second belt wound around the second-arm-driving-reducer output pulley; and
    a second joint pulley connected to the base end portion of the second arm and configured to be rotated together with the second-arm-driving-reducer output pulley by the second belt, and
    wherein the second-arm-driving-reducer input pulley, the second-arm-driving reducer, the second-arm-driving-reducer output pulley, the second belt and the second joint pulley are accommodated within the first enlarged portion.

2. The robot of claim 1, wherein the distance between the first joint pulley and the second-arm-driving-reducer input pulley is greater than the distance between the second-arm-driving-reducer output pulley and the second joint pulley.

3. The robot of claim 1, wherein the second-arm-driving-reducer input pulley, the output shaft of the second-arm-driving reducer and the second-arm-driving-reducer output pulley are arranged in a coaxial relationship with one another, and
    wherein the second-arm-driving-reducer output pulley is formed into a cup shape to enclose the second-arm-driving reducer and includes a cylinder portion for covering an outer circumferential surface of the second-arm-driving reducer, the cylinder portion being provided with belt teeth meshing with the second belt.

4. The robot of claim 1, wherein the first belt is smaller in width than the second belt.

5. The robot of claim 1, further comprising:
    a fork driving motor accommodated within the second joint pulley;
    a fork-driving pulley accommodated within the second arm and configured to be rotated by the fork driving motor;
    a fork-driving input belt wound around the fork-driving pulley;
    a fork-driving-reducer input pulley configured to be rotated together with the fork-driving pulley by the fork-driving input belt;
    a fork-driving reducer to which the rotation of the fork-driving-reducer input pulley is inputted;
    a fork-driving-reducer output pulley provided to an output shaft of the fork-driving reducer;
    a fork-driving output belt wound around the fork-driving-reducer output pulley; and
    a third joint pulley connected to the base end portion of the fork and configured to be rotated together with the fork-driving-reducer output pulley by the fork-driving output belt,
    wherein the fork-driving-reducer input pulley, the fork-driving reducer, the fork-driving-reducer output pulley, the fork-driving output belt and the third joint pulley are accommodated within the second enlarged portion.

6. The robot of claim 5, wherein the distance between the fork-driving pulley and the fork-driving-reducer input pulley is greater than the distance between the fork-driving-reducer output pulley and the third joint pulley.

7. The robot of claim 5, wherein the fork-driving input belt is smaller in width than the fork-driving output belt.

8. The robot of claim 1, wherein the fork includes a first fork and a second fork independently rotatable about the third joint, and the robot further comprises:
    a first-fork-driving motor and a second-fork-driving motor accommodated within the second joint pulley for respectively driving the first fork and the second fork;
    a first-fork-driving pulley and a second-fork-driving pulley configured to be rotated by the first-fork-driving motor and the second-fork-driving motor, respectively;
    a first-fork-driving input belt and a second-fork-driving input belt wound around the first-fork-driving pulley and the second-fork-driving pulley, respectively;
    a first-fork-driving-reducer input pulley configured to be rotated together with the first-fork-driving pulley by the first-fork-driving input belt;

a second-fork-driving-reducer input pulley configured to be rotated together with the second-fork-driving pulley by the second-fork-driving input belt;

a first-fork-driving reducer to which the rotation of the first-fork-driving-reducer input pulley is inputted;

a second-fork-driving reducer to which the rotation of the second-fork-driving-reducer input pulley is inputted;

a first-fork-driving-reducer output pulley provided in an output shaft of the first-fork-driving reducer;

a second-fork-driving-reducer output pulley provided in an output shaft of the second-fork-driving reducer;

a first-fork-driving output belt wound around the first-fork-driving-reducer output pulley;

a second-fork-driving output belt wound around the second-fork-driving-reducer output pulley;

a first-fork-driving third joint pulley connected to a base end portion of the first fork and configured to be rotated together with the first-fork-driving-reducer output pulley by the first-fork-driving output belt; and a second-fork-driving third joint pulley connected to a base end portion of the second fork and configured to be rotated together with the second-fork-driving-reducer output pulley by the second-fork-driving output belt, wherein the first-fork-driving pulley, the second-fork-driving pulley, the first-fork-driving-reducer input pulley and the second-fork-driving-reducer input pulley are at least partially overlapped with one another horizontally, and the second-fork-driving pulley, the second-fork-driving input belt and the second-fork-driving-reducer input pulley being arranged in a space surrounded by the first-fork-driving pulley, the first-fork-driving input belt and the first-fork-driving-reducer input pulley when seen in a plan view.

9. The robot of claim 5, further comprising:

a fork cable arranged to extend from the body to the fork through the first arm and the second arm; and a winding unit provided in the base end portion of the fork, wherein the second arm includes a cable release space provided therein, the cable release space being defined below the fork-driving input belt extending between the fork-driving pulley and the fork-driving-reducer input pulley when seen in a plan view, and a cable passage for interconnecting the winding unit and the cable release space, the cable passage being defined to extend along a longitudinal direction of the second arm on a side of the fork-driving reducer, and wherein the fork cable extends to the fork via the cable release space, the cable passage and the winding unit, the fork cable being wound around the winding unit when the fork rotates about the third joint in a first direction and loosened in the cable release space when the fork rotates about the third joint in a second direction opposite to the first direction.

10. The robot of claim 1, further comprising:

a first arm drive shaft of hollow cylindrical shape having an upper end fixed to the first arm; and a first arm drive motor provided within the body for rotating the first arm drive shaft, the first arm drive shaft being arranged to accommodate the second arm drive motor.

11. The robot of claim 10, further comprising:

a lift mechanism accommodated within the body for lifting and lowering the first arm drive shaft.

12. A substrate transfer system comprising the horizontal articulated robot of claim 1.

* * * * *